(12) United States Patent
Oh et al.

(10) Patent No.: US 12,142,515 B2
(45) Date of Patent: Nov. 12, 2024

(54) SUBSTRATE PROCESSING APPARATUS

(71) Applicant: JUSUNG ENGINEERING CO., LTD., Gwangju-si (KR)

(72) Inventors: DongHyuk Oh, Gwangju-si (KR); Su-Young Kwon, Gwangju-si (KR); JongSik Kim, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 339 days.

(21) Appl. No.: 17/417,752

(22) PCT Filed: Dec. 26, 2019

(86) PCT No.: PCT/KR2019/018512
§ 371 (c)(1),
(2) Date: Jun. 23, 2021

(87) PCT Pub. No.: WO2020/138970
PCT Pub. Date: Jul. 2, 2020

(65) Prior Publication Data
US 2022/0074049 A1 Mar. 10, 2022

(30) Foreign Application Priority Data
Dec. 26, 2018 (KR) .......................... 10-2018-0169104

(51) Int. Cl.
*C23C 16/455* (2006.01)
*C23C 16/44* (2006.01)
(Continued)

(52) U.S. Cl.
CPC .... *H01L 21/68771* (2013.01); *C23C 16/4401* (2013.01); *C23C 16/45519* (2013.01); *C23C 16/45544* (2013.01); *H01L 21/67069* (2013.01)

(58) Field of Classification Search
CPC ......... H01L 21/68771; H01L 21/67069; H01L 21/6719; H01L 21/67034; H01L 21/67207;
(Continued)

(56) References Cited

U.S. PATENT DOCUMENTS 8,808,456 B2 8/2014 Kato et al.
10,604,839 B2 3/2020 Inada et al.
(Continued)

FOREIGN PATENT DOCUMENTS

CN 104380434 A 2/2015
JP 2007247066 A 9/2007
(Continued)

OTHER PUBLICATIONS

English translation of KR 10-2010-0027040, original was filed in the IDS (Year: 2023).*

*Primary Examiner* — Aiden Lee
(74) *Attorney, Agent, or Firm* — Renaissance IP Law Group LLP

(57) ABSTRACT

The present disclosure relates to a substrate processing apparatus including: a chamber; a supporting part coupled to the chamber to support the substrate; a lid disposed on the supporting part and coupled to the chamber; a purge gas injection unit coupled to the lid to inject a purge gas to a processing space between the lid and the supporting part, for dividing the processing space into a plurality of processing regions; a shield disposed between the lid and the supporting part and coupled to the lid; a first injection unit injecting a first gas to a first processing region of the processing regions; a second injection unit injecting the first gas to the first processing region at a position apart from the first injection unit; and a first partition wall part coupled to the shield so that a first injection region disposed under the first injection unit, a second injection region disposed under the
(Continued)

second injection unit, and a first separation space between the first injection region and the second injection region are included in a region where a processing process using the first gas is performed.

16 Claims, 13 Drawing Sheets

(51) Int. Cl.
*H01L 21/67* (2006.01)
*H01L 21/687* (2006.01)

(58) Field of Classification Search
CPC .......... C23C 16/45519; C23C 16/4401; C23C 16/45523; C23C 16/45544
See application file for complete search history.

(56) References Cited

U.S. PATENT DOCUMENTS

| | | |
|---|---|---|
| 2007/0218702 A1 | 9/2007 | Shimizu et al. |
| 2010/0050942 A1 | 3/2010 | Kato et al. |
| 2010/0055319 A1 | 3/2010 | Kato et al. |
| 2010/0059478 A1 | 3/2010 | Lee et al. |
| 2012/0094011 A1 | 4/2012 | Hishiya et al. |
| 2016/0053373 A1* | 2/2016 | Inada ............... C23C 16/34 438/778 |
| 2016/0358794 A1 | 12/2016 | Miura |
| 2018/0033674 A1 | 2/2018 | Jeong et al. |

FOREIGN PATENT DOCUMENTS

| | | |
|---|---|---|
| JP | 2010056477 A | 3/2010 |
| JP | 2012519956 A | 8/2012 |
| JP | 2013060615 A | 6/2015 |
| JP | 2016042561 A | 3/2016 |
| JP | 2018029120 A | 7/2020 |
| KR | 20100027040 A | 3/2010 |
| KR | 101562396 B1 | 10/2015 |
| KR | 20170028744 A | 3/2017 |
| KR | 20170139285 A | 12/2017 |
| KR | 20180013034 A | 2/2018 |
| KR | 20180027205 A | 3/2018 |
| TW | 201828369 A | 8/2018 |

\* cited by examiner

SUBSTRATE PROCESSING APPARATUS

TECHNICAL FIELD

The present inventive concept relates to a substrate processing apparatus which performs a processing process such as a deposition process and an etching process on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a processing process is performed on a substrate, and examples of the processing process include a deposition process of depositing a thin film including a specific material on the substrate, a photo process of selectively exposing a portion of a thin film by using a photosensitive material, an etching process of removing the selectively exposed portion of the thin film to form a pattern, etc. Such a processing process is performed on a substrate by a substrate processing apparatus.

FIG. 1 is a schematic side cross-sectional view of a related art substrate processing apparatus.

Referring to FIG. 1, a related art substrate processing apparatus 10 includes a supporting part 11, a injection unit 12, and a purge unit 13.

The supporting part 11 supports a plurality of substrates 20. The supporting part 11 supports the substrates 20 so that the substrates 20 are disposed under the injection unit 12.

The injection unit 12 injects a process gas. The injection unit 12 injects the process gas to a plurality of processing regions PA1 and PA2. The process gas is for performing a processing process such as a deposition process and an etching process. The injection unit 12 injects different kinds of process gases to the processing regions PA1 and PA2.

The purge unit 13 injects a purge gas. The purge unit 13 injects the purge gas to a center region CA disposed between the substrates 20 supported by the supporting part 11. The center region CA is disposed between the processing regions PA1 and PA2. The purge unit 13 injects the purge gas to the center region CA, and thus, prevents the different kinds of process gases, injected by the injection unit 12, from being mixed with one another.

Here, when the amount of purge gas injected to the center region CA by the purge unit 13 is high, the process gas injected to the processing regions PA1 and PA2 by the injection unit 12 is pushed in an outward direction by the purge gas. Due to this, under-deposition and under-etching occur relatively in inner portions of the substrates 20 in a direction toward the center region CA.

When the amount of purge gas injected to the center region CA by the purge unit 13 is low, the process gas injected to the processing regions PA1 and PA2 by the injection unit 12 is diffused to the center region CA. The process gas diffused to the center region CA stays in the center region CA and then is pushed in the outward direction by the purge gas and a centrifugal force which acts based on a rotation of the supporting part 11, thereby flowing to the processing regions PA1 and PA2 again. Due to this, over-deposition and over-etching occur relatively in inner portions of the substrates 20.

As described above, the related art substrate processing apparatus 10 has a problem where it is difficult to secure the uniformity of a processing process performed on the substrates 20.

DISCLOSURE

Technical Problem

The present inventive concept is devised to solve the above-described problem and is for providing substrate processing apparatuses for enhancing the uniformity of a processing process performed on a substrate.

Technical Solution

To accomplish the above-described object, the present inventive concept may include the following elements.

A substrate processing apparatus according to the present inventive concept may include: a chamber where a processing process is performed on a substrate; a supporting part coupled to the chamber to support the substrate; a lid disposed on the supporting part and coupled to the chamber; a purge gas injection unit coupled to the lid to inject a purge gas to the processing space, for dividing a processing space between the lid and the supporting part into a plurality of processing regions; a shield disposed between the lid and the supporting part and coupled to the lid; a first injection unit injecting a first gas to a first processing region of the processing regions; a second injection unit injecting the first gas to the first processing region at a position apart from the first injection unit; and a first partition wall part coupled to the shield so that a first injection region disposed under the first injection unit, a second injection region disposed under the second injection unit, and a first separation space between the first injection region and the second injection region are included in a region where a processing process using the first gas is performed.

Advantageous Effect

According to the present inventive concept, the following effects may be obtained.

The present inventive concept may be implemented to enlarge a size of a space where a processing process is performed, thereby increasing a processing rate of a processing process performed on a substrate.

The present inventive concept may be implemented to increase a flow rate and a density of a processing gas in a space where a processing process is performed, and thus, may increase a processing rate of a processing process performed on a substrate and may decrease a flow rate of a processing gas which is not used for the processing process and is wasted, thereby reducing the operating cost.

The present inventive concept may be implemented to decrease a degree to which a difference of a processing rate occurs partially in substrates due to a purge gas in performing a processing process on the substrate, thereby enhancing the uniformity of a processing process performed on the substrate.

MODE FOR INVENTION

Hereinafter, an embodiment of a substrate processing apparatus according to the present inventive concept will be described in detail with reference to the accompanying drawings.

Figure 1:
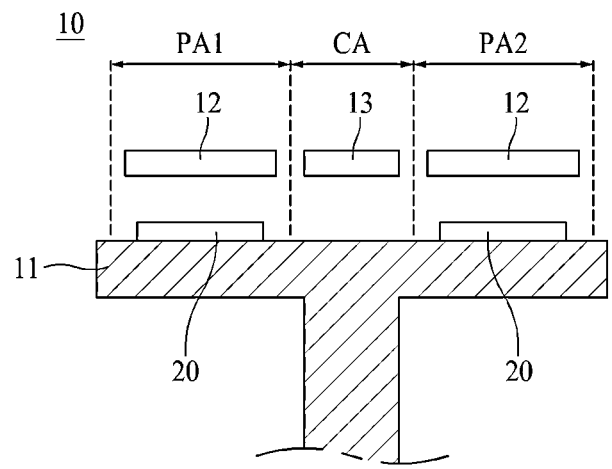
FIG. 1 is a schematic side cross-sectional view of a related art substrate processing apparatus.
Figure 2:
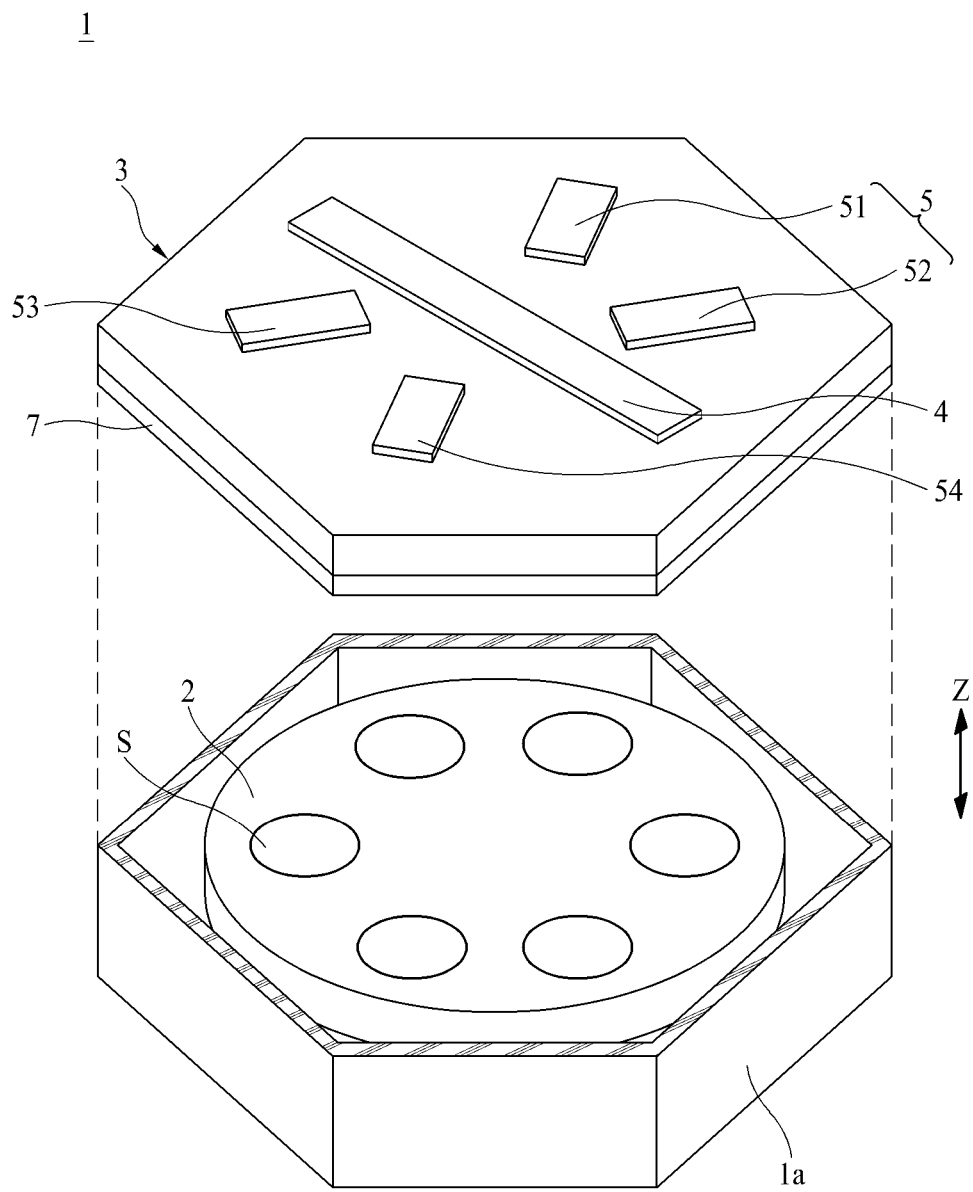
FIG. 2 is a schematic exploded perspective view of a substrate processing apparatus according to the present inventive concept.
Figure 3:
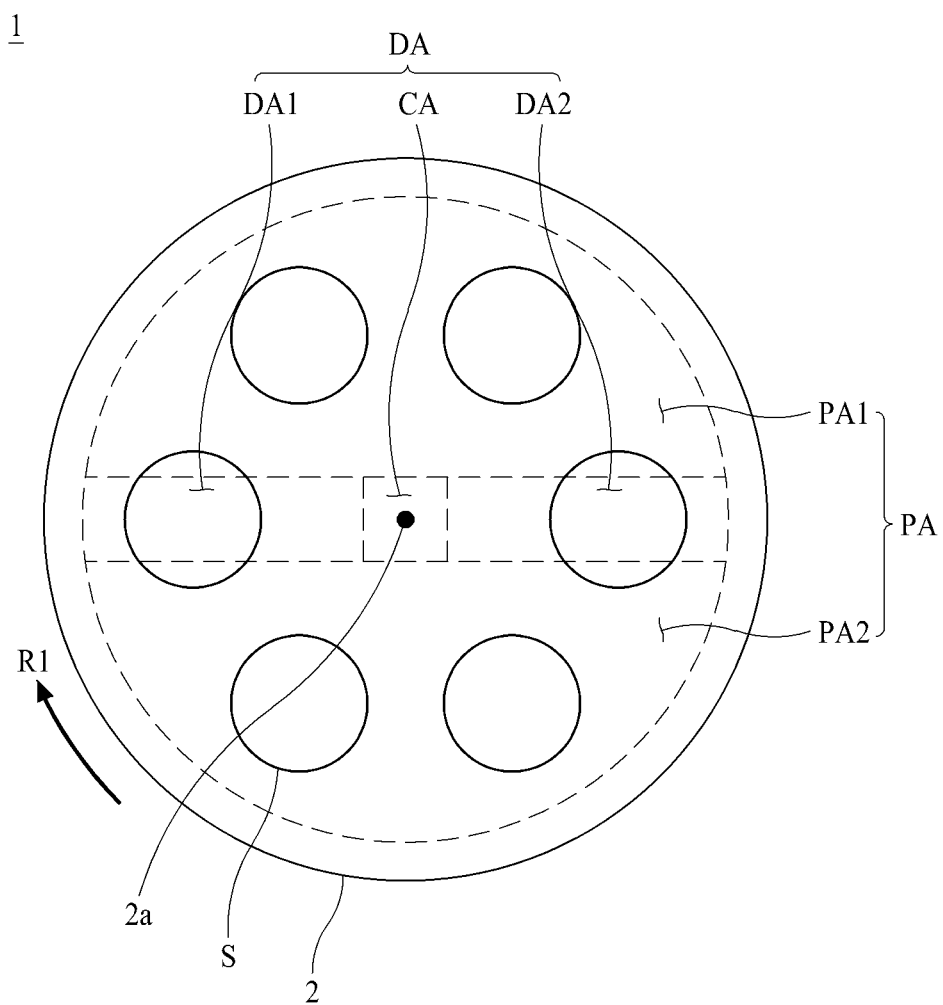
FIG. 3 is a conceptual plan view of a substrate processing apparatus according to the present inventive concept.
Figure 4:
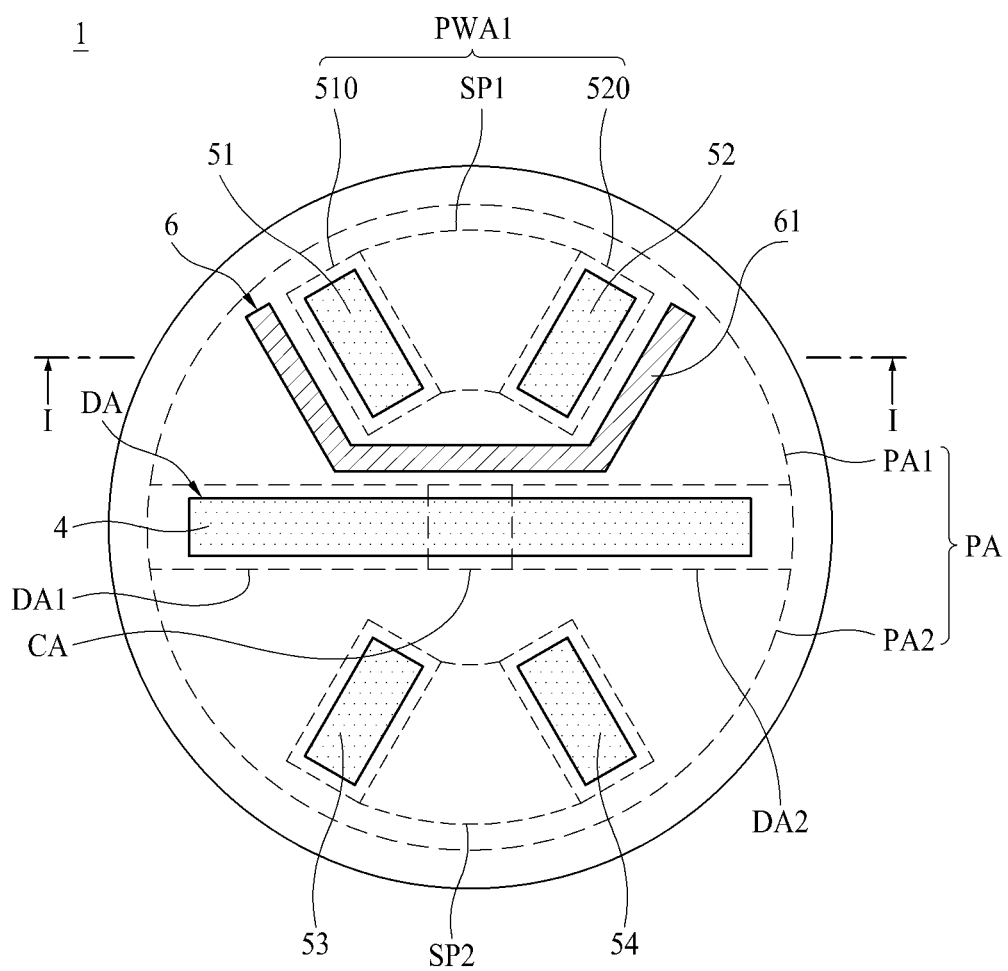
FIG. 4 is a conceptual plan view of a injection unit, a purge gas injection unit, and a partition wall means in a substrate processing apparatus according to the present inventive concept.
Figure 5:
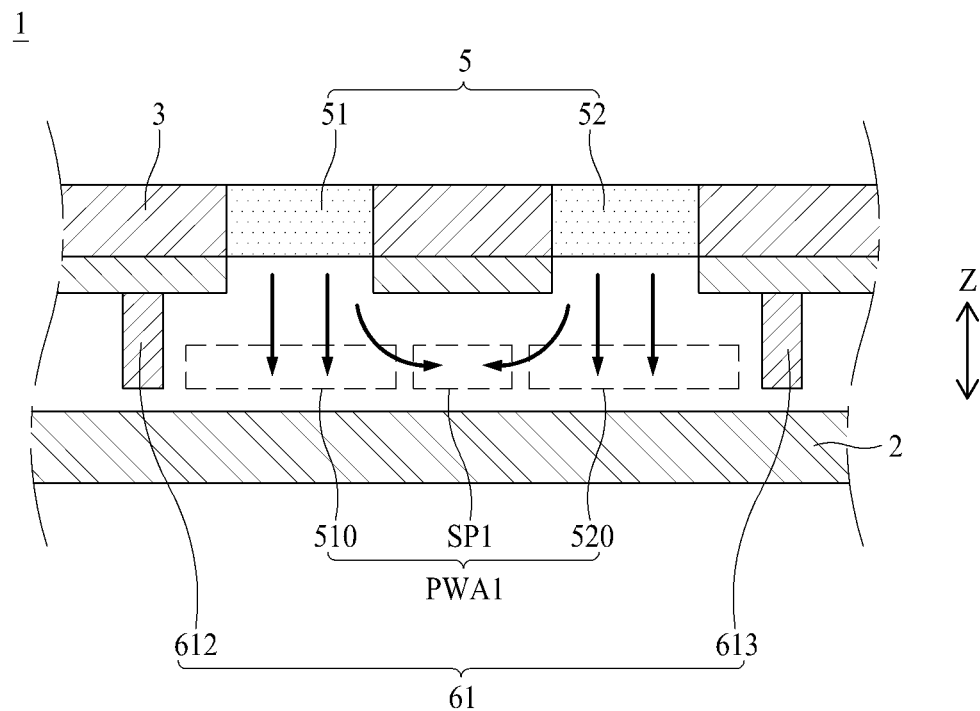
FIG. 5 is a schematic side cross-sectional view taken along line I-I of FIG. 4 in a substrate processing apparatus according to the present inventive concept.

Referring to FIGS. 2 to 4, a substrate processing apparatus 1 according to the present inventive concept performs a processing process on a substrate S. For example, the substrate processing apparatus 1 according to the present inventive concept may perform at least one of a deposition process of depositing a thin film on the substrate S and an etching process of removing a portion of the thin film deposited on the substrate S. The substrate processing apparatus 1 according to the present inventive concept includes a supporting part 2, a lid 3, a purge gas injection unit 4, a injection means 5, a partition wall means 6 (illustrated in FIG. 4), and a shield 7 (illustrated in FIG. 2).

Referring to FIGS. 2 and 3, the supporting part 2 supports the substrate S. The supporting part 2 may be coupled to an inner portion of a chamber 1a providing a processing space where the processing process is performed. The processing space may be disposed between the supporting part 2 and the lid 3. An exhaust unit (not shown) for exhausting a gas remaining in the processing space may be coupled to the chamber 1a. The substrate S may be loaded into the chamber 1a by a loading apparatus (not shown) disposed outside the chamber 1a, and then, may be supported by the supporting part 2. When the processing process is completed, the substrate S may be unloaded to the outside of the chamber 1a by an unloading apparatus (not shown) disposed outside the chamber 1a. The substrate S may be a semiconductor substrate or a wafer.

The supporting part 2 may support a plurality of substrates S. The substrates S may be supported by the supporting part 2 so as to be disposed at positions apart from one another. For example, the substrates S may be disposed at positions apart from one another at the same angle with respect to a center of the supporting part 2. In FIGS. 2 and 3, six substrates are illustrated as being supported by the supporting part 2, but are not limited thereto. Two, three, four, five, or seven or more substrates S may be supported by the supporting part 2.

The supporting part 2 may rotate about a rotational shaft 2a (illustrated in FIG. 3). The supporting part 2 may rotate in a first rotational direction (an R1 arrow direction) (illustrated in FIG. 3). The first rotational direction (the R1 arrow direction) may be a clockwise direction or a counterclockwise direction with respect to the rotational shaft 2a. The substrates S may be supported by the supporting part 2 so as to be spaced apart from one another at the same angle in the first rotational direction (the R1 arrow direction) with respect to the rotational shaft 2a. Although not shown, a plurality of supporting members by which the substrates S are supported may be coupled to the supporting part 2. The rotational shaft 2a of the supporting part 2 and the center of the supporting part 2 may be at the same position.

As the supporting part 2 rotates about the rotational shaft 2a, the substrates S may revolve about the rotational shaft 2a. The supporting part 2 may be coupled to a driver (not shown) which provides a rotational force. When the supporting members are coupled to the supporting part 2, each of the supporting members may rotate about a rotational shaft thereof. In this case, the substrate processing apparatus 1 according to the present inventive concept may perform a processing process on the substrates S while the substrates S are rotating and revolving.

Referring to FIG. 2, the lid 3 is disposed upper the supporting part 2. The lid 3 may be coupled to the chamber 1a to cover an upper portion of the chamber 1a. The lid 3 and the chamber 1a may be provided in a hexagonal structure as illustrated in FIG. 2, but are not limited thereto and may be provided in a cylindrical structure, an oval structure, a polygonal structure, or the like.

The lid 3 may be disposed upward apart from the supporting part 2. The lid 3 may support the purge gas injection unit 4 and the injection means 5. Each of the purge gas injection unit 4 and the injection means 5 may be disposed upward apart from the supporting part 2 and may be coupled to the lid 3.

Referring to FIGS. 2 to 4, the purge gas injection unit 4 injects a purge gas. The purge gas injection unit 4 may inject the purge gas to the processing space, and thus, the processing space may be divided into a plurality of processing regions PA. The purge gas may be irrelevant to a processing process performed on the substrate S, and for example, may be an inert gas such as argon (Ar). In FIG. 3, the processing space is illustrated as being divided into two processing regions PA1 and PA2, but is not limited thereto and may be divided into three or more processing regions PA.

The purge gas injection unit 4 may be coupled to the lid 3. The purge gas injection unit 4 may be coupled to the lid 3 so as to be disposed on the supporting part 2. The purge gas injection unit 4 may inject the purge gas in a downward direction from a portion on the supporting part 2 to the supporting part 2. A first coupling hole (not shown) to be coupled to the purge gas injection unit 4 may be provided in the lid 3. The purge gas injection unit 4 may be inserted into the first coupling hole, and thus, may be coupled to the lid 3. The first coupling hole may be provided to pass through the lid 3.

The purge gas injection unit 4 may inject the purge gas to a center region CA (illustrated in FIG. 3). The center region CA may be disposed between the substrates S supported by the supporting part 2. The purge gas injection unit 4 may inject the purge gas to the center region CA, and thus, may prevent different kinds of process gases, injected through the center region CA from the injection means 5, from being mixed.

The purge gas injection unit 4 may inject the purge gas to each of a first division region DA1 (illustrated in FIG. 3) and a second division region DA2 (illustrated in FIG. 3). The first division region DA1 may be disposed between the processing regions PA at one side of the center region CA. The purge gas injection unit 4 may inject the purge gas to the first division region DA1, thereby preventing different kinds of processing gases, injected through the first division region DA1 from the injection means 5, from being mixed. The second division region DA2 may be disposed between the processing regions PA at the other side of the center region CA. The purge gas injection unit 4 may inject the purge gas to the second division region DA2, thereby preventing different kinds of processing gases, injected through the second division region DA2 from the injection means 5, from being mixed.

The purge gas injection unit 4 may be implemented in a shape which enables the purge gas to be injected to the center region CA, the first division region DA1, and the second division region DA2. For example, when the center region CA, the first division region DA1, and the second division region DA2 are disposed in a rectilinear shape, the purge gas injection unit 4 may be implemented in a rectilinear shape. For example, when the center region CA, the first division region DA1, and the second division region DA2 are disposed in a Y-shape, the purge gas injection unit 4 may be implemented in a Y-shape.

The purge gas injection unit 4 may be implemented to inject the purge gas to the center region CA, the first division region DA1, and the second division region DA2 by using one gas injection module. Although not shown, the purge gas injection unit 4 may be implemented to inject the purge gas to the center region CA, the first division region DA1, and the second division region DA2 by using a plurality of gas injection modules. In this case, the purge gas injection unit 4 may include a first gas injection module which injects the purge gas to the center region CA, a second gas injection module which injects the purge gas to the first division region DA1, and a third gas injection module which injects the purge gas to the second division region DA2.

Although not shown, the purge gas injection unit 4 may be implemented to inject the purge gas to the center region CA and to inject the purge gas to three or more division regions DA. In this case, the purge gas injection unit 4 may be implemented so that the gas injection module is provided in plurality to correspond to the division regions DA.

Referring to FIGS. 2 to 5, the injection means 5 injects a processing gas. The injection means 5 may inject the processing gas to the processing regions PA. Therefore, the processing process using the processing gas may be performed on substrates S located in the processing regions PA. When the substrates S revolves along a revolution path with respect to the rotational shaft 2a, the injection means 5 may inject the processing gas to a plurality of processing regions PA1 and PA2 (illustrated in FIG. 3) disposed along the revolution path. In this case, the substrates S may sequentially pass through the processing regions PA1 and PA2 while revolving along the revolution path. In a process where the substrates S sequentially pass through the processing regions PA1 and PA2, the processing process may be performed on substrates S.

The injection means 5 may include a first injection unit 51 and a second injection unit 52.

The first injection unit 51 injects a first gas to a first processing region PA1. The first processing region PA1 corresponds to one of processing regions PA divided by the purge gas injection unit 4. The first gas corresponds to one of processing gases used for the processing process. When the processing process is a deposition process of depositing a thin film on the substrate S by using a source gas and a reactant gas, the first gas may be the source gas.

The first injection unit 51 may be coupled to the lid 3. The first injection unit 51 may be coupled to the lid 3 so as to be disposed on the supporting part 2. The first injection unit 51 may inject the first gas in a downward direction from a portion on the supporting part 2 to the supporting part 2. A second coupling hole (not shown) to be coupled to the first injection unit 51 may be provided in the lid 3. The first injection unit 51 may be inserted into the second coupling hole, and thus, may be coupled to the lid 3. The second coupling hole may be provided to pass through the lid 3.

The second injection unit 52 injects the first gas to the first processing region PA1. The second injection unit 52 may be coupled to the lid 3. The second injection unit 52 may inject the first gas in a downward direction from a portion on the supporting part 2 to the supporting part 2. A third coupling hole (not shown) to be coupled to the second injection unit 52 may be provided in the lid 3. The second injection unit 52 may be inserted into the third coupling hole, and thus, may be coupled to the lid 3. The third coupling hole may be provided to pass through the lid 3.

The second injection unit 52 may be coupled to the lid 3 at a position apart from the first injection unit 51. Therefore, the second injection unit 52 and the first injection unit 51 may inject the first gas to different portions of the first processing region PA1. In this case, the first injection unit 51 may inject the first gas to a first injection region 510 included in the first processing region PA1. The first injection region 510 is disposed under the first injection unit 51. The second injection unit 52 may inject the first gas to a second injection region 520 included in the first processing region PA1. The second injection region 520 is disposed under the second injection unit 52. The second injection unit 52 and the first injection unit 51 may be disposed at positions apart from each other, and thus, the second injection region 520 and the first injection region 510 may be disposed at positions apart from each other. In this case, a first separation space SP1 (illustrated in FIG. 4) may be disposed between the second injection region 520 and the first injection region 510.

Although not shown, the injection means 5 may include three or more injection mechanisms which inject the first gas. The injection mechanisms which inject the first gas may be coupled to the lid 3 at positions apart from one another. In this case, the injection mechanisms may individually inject the first gas to injection regions disposed apart from one another in the first processing region.

The injection means 5 may further include a third injection unit 53.

The third injection unit 53 injects a second gas to a second processing region PA2. The second processing region PA2 corresponds to one of the processing regions PA divided by the purge gas injection unit 4. The second gas corresponds to one of the processing gases used for the processing process. The second gas and the first gas may be different gases. When the processing process is a deposition process of depositing a thin film on the substrate S by using the source gas and the reactant gas, the second gas may be the reactant gas. In this case, the first gas may be the source gas. When the second gas is the source gas, the first gas may be the reactant gas.

The third injection unit 53 may be coupled to the lid 3. The third injection unit 53 may be coupled to the lid 3 so as to be disposed on the supporting part 2. The third injection unit 53 may inject the second gas in a downward direction from a portion on the supporting part 2 to the supporting part 2. A fourth coupling hole (not shown) to be coupled to the third injection unit 53 may be provided in the lid 3. The third injection unit 53 may be inserted into the fourth coupling hole, and thus, may be coupled to the lid 3. The fourth coupling hole may be provided to pass through the lid 3.

The injection means 5 may further include a fourth injection unit 54.

The fourth injection unit 54 injects the second gas to the second processing region PA2. The fourth injection unit 54 may be coupled to the lid 3. The fourth injection unit 54 may inject the second gas in a downward direction from a portion on the supporting part 2 to the supporting part 2. A fifth coupling hole (not shown) to be coupled to the fourth injection unit 54 may be provided in the lid 3. The fourth injection unit 54 may be inserted into the fifth coupling hole, and thus, may be coupled to the lid 3. The fifth coupling hole may be provided to pass through the lid 3.

The fourth injection unit 54 may be coupled to the lid 3 at a position apart from the third injection unit 53. Therefore, the fourth injection unit 54 and the third injection unit 53 may inject the second gas to different portions of the second processing region PA2. In this case, the third injection unit 53 may inject the second gas to a third injection region 530 included in the second processing region PA2. The third injection region 530 is disposed under the third injection unit 53. The fourth injection unit 54 may inject the second gas to a fourth injection region 540 included in the second processing region PA2. The fourth injection region 540 is disposed under the fourth injection unit 54. The fourth injection unit 54 and the third injection unit 53 may be disposed at positions apart from each other, and thus, the fourth injection region 540 and the third injection region 530 may be disposed at positions apart from each other. In this case, a second separation space SP2 (illustrated in FIG. 4) may be disposed between the fourth injection region 540 and the third injection region 530.

Although not shown, the injection means 5 may include three or more injection mechanisms which inject the second gas. The injection mechanisms which inject the second gas may be coupled to the lid 3 at positions apart from one another. In this case, the injection mechanisms may individually inject the second gas to injection regions disposed apart from one another in the second processing region.

Referring to FIGS. 2 to 6, the partition wall means 6 is coupled to the shield 7. The partition wall means 6 may be coupled to the shield 7 so as to be disposed on the supporting part 2. The partition wall means 6 may protrude downward from the shield 7 with respect to a vertical direction.

The partition wall means 6 may include a first partition wall part 61.

The first partition wall part 61 may be coupled to the shield 7 so that the first injection region 510, the second injection region 520, and the first separation space SP1 are included in a region where a processing process using the first gas is performed. Accordingly, the substrate processing apparatus 1 according to the present inventive concept may obtain the following effects.

Figure 6:
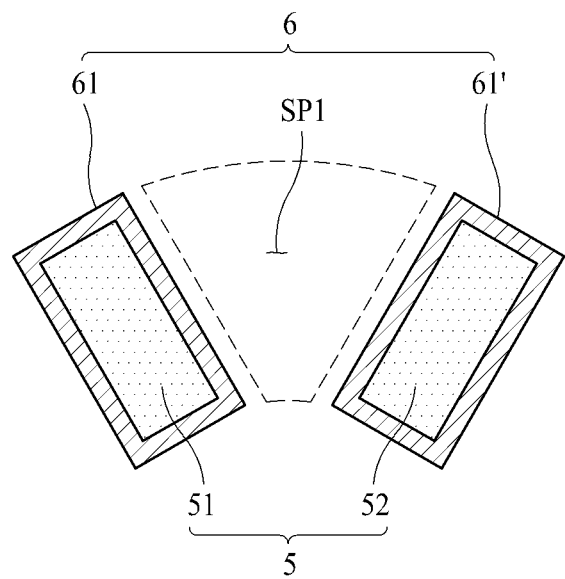
FIG. 6 is a conceptual plan view illustrating a comparative example where partition wall mechanisms are respectively coupled to injection mechanisms.

First, the first partition wall part 61 may be implemented to allow the first gas injected by the first injection unit 51 and the first gas injected by the second injection unit 52 to be diffused toward the first separation space SP1. Therefore, comparing with a comparative example where the first partition wall part 61 is coupled to the first injection unit 51 and a first partition wall part 61' is coupled to the second injection unit 52 as illustrated in FIG. 6, the substrate processing apparatus 1 according to the present inventive concept may increase a flow rate of the first gas which is in the first separation space SP1. In the comparative example, the first partition wall parts 61 and 61' may prevent the first gas, injected by the first injection unit 51 and the second injection unit 52, from being diffused toward the first separation space SP1, and thus, a flow rate of the first gas in the first separation space SP1 may be lower than an embodiment inevitably.

Therefore, the substrate processing apparatus 1 according to the present inventive concept may be implemented so that a processing process using the first gas is performed in the first separation space SP1 as well as the first injection region 510 and the second injection region 520. Accordingly, comparing with the comparative example, the substrate processing apparatus 1 according to the present inventive concept may enlarge a size of a space where the processing process using the first gas is performed, and thus, may increase a processing rate of the processing process using the first gas. When the processing process is performed while the substrates S are revolving based on a rotation of the supporting part 2, the substrate processing apparatus 1 according to the present inventive concept may increase a time for which the substrates S are processed by the first gas by using the first partition wall part 61, thereby increasing a processing rate of the processing process using the first gas.

Second, the substrate processing apparatus 1 according to the present inventive concept may prevent the first gas injected by the first injection unit 51 and the first gas injected by the second injection unit 52 from being diffused to an outer side of the first separation space SP1. Therefore, the substrate processing apparatus 1 according to the present inventive concept may increase a density and a flow rate of the first gas which is in the first separation space SP1. Accordingly, the substrate processing apparatus 1 according to the present inventive concept may more increase a processing rate of the processing process using the first gas. Also, the substrate processing apparatus 1 according to the present inventive concept may decrease a flow rate of the first gas which is not used for the processing process and is wasted, thereby reducing the operating cost.

Third, the substrate processing apparatus 1 according to the present inventive concept may prevent the purge gas injected by the purge gas injection unit 4 from flowing into an inner portion of the first partition wall part 61. Therefore, the substrate processing apparatus 1 according to the present inventive concept may decrease a degree to which under-deposition and under-etching occur relatively in inner portions of the substrates S, in a process of performing a processing process using the first gas. Accordingly, the substrate processing apparatus 1 according to the present inventive concept may enhance the uniformity of the processing process using the first gas. The inner portions of the substrates S may be portions disposed toward the center region CA.

The first partition wall part 61 may be coupled to the shield 7 to surround the first injection region 510, the second injection region 520, and the first separation space SP1. Therefore, the first partition wall part 61 may form one space where the first injection region 510, the second injection region 520, and the first separation space SP1 communicate with one another. The first partition wall part 61 may surround the first injection region 510, the second injection region 520, and the first separation space SP1 in a partially open shape. For example, the first partition wall part 61 may surround the first injection region 510, the second injection region 520, and the first separation space SP1 in a shape where a portion opposite to the center region CA is open. Although not shown, the first partition wall part 61 may surround the first injection region 510, the second injection region 520, and the first separation space SP1 in a closed shape.

The first partition wall part 61 may be coupled to the shield 7 to protrude downward from the shield 7 with respect to a vertical direction (a Z-axis direction). Therefore, the first partition wall part 61 may prevent the first gas from being diffused to the outside, and moreover, may prevent the purge gas from flowing into the inside. The first partition wall part 61 may be provided to have a length which is shorter than a distance by which the shield 7 is apart from the supporting part 2, with respect to the vertical direction (the Z-axis direction). Accordingly, the first partition wall part 61 may be apart from the supporting part 2. Therefore, in the substrate processing apparatus 1 according to the present inventive concept, the first partition wall part 61 and the supporting part 2 may be disposed so that interference does not occur therebetween, and thus, even when a processing process is performed while the substrates S are revolving based on a rotation of the supporting part 2, collision between the first partition wall part 61 and the supporting part 2 may be prevented. In this case, the first partition wall part 61 may be coupled to the shield 7 so as to be disposed at a position upward apart from the substrate S supported by the supporting part 2.

The first partition wall part 61 may protrude to form a first partition wall region PWA1 (illustrated in FIG. 4) where the first injection region 510, the second injection region 520, and the first separation space SP1 communicate with one another. In this case, the first injection unit 51 may inject the first gas to the first injection region 510 so that the first gas is diffused in the first partition wall region PWA1. The second injection unit 52 may inject the first gas to the second injection region 520 so that the first gas is diffused in the first partition wall region PWA1. That is, the first partition wall part 61 may form one first partition wall region PWA1 including the first injection region 510, the second injection region 520, and the first separation space SP1. Accordingly, the substrate processing apparatus 1 according to the present inventive concept may be implemented so that a processing process using the first gas is performed in the whole first partition wall region PWA1.

The first partition wall part 61 may be coupled to the shield 7 so that the first partition wall region PWA1 has a size which is less than that of the first processing region PA1. Therefore, comparing with a case where each of the first injection unit 51 and the second injection unit 52 injects the first gas to the first processing region PA1 without the first partition wall part 61, the substrate processing apparatus 1 according to the present inventive concept may increase a density and a flow rate of the first gas which is in the first partition wall region PWA1. Accordingly, the substrate processing apparatus 1 according to the present inventive concept may more increase a processing rate of the processing process using the first gas. A size of each of the first partition wall region PWA1 and the first processing region PA1 may be a size of an area with respect to a horizontal direction vertical to the vertical direction (the Z-axis direction).

The first partition wall part 61 may be disposed apart from each of the first injection unit 51 and the second injection unit 52. Therefore, the substrate processing apparatus 1 according to the present inventive concept may increase a size of the first partition wall region PWA1 by a distance by which the first partition wall part 61 is apart from each of the first injection unit 51 and the second injection unit 52. Accordingly, the substrate processing apparatus 1 according to the present inventive concept may increase a size of a space where the processing process using the first gas is performed, thereby increasing a processing rate of the processing process using the first gas.

Although not shown, in a case where the injection means 5 includes three or more injection mechanisms which inject the first gas, the first partition wall part 61 may be coupled to the shield 7 so that the three or more injection mechanisms are located in the first partition wall region PWA1. The partition wall means 6 may include a plurality of first partition wall parts 61. In this case, the first partition wall parts 61 may be coupled to the shield 7 to individually implement the first partition wall regions PWA1. Two or more injection mechanisms injecting the first gas may be disposed in each of the first partition wall regions PWA1.

Referring to FIGS. 2 to 8, the first partition wall part 61 may include a first partition wall member 611.

The first partition wall member 611 is disposed between the center region CA and the first partition wall region PWA1. Therefore, the first partition wall member 611 may prevent the first gas, injected by the first injection unit 510 and the second injection unit 520, from flowing from the first partition wall region PWA1 to the center region CA. In this case, a flow direction of the first gas blocked by the first partition wall member 611 may be changed so that the first gas flows in an outward direction (an OD arrow direction) (illustrated in FIG. 7), and the first gas may be used for the processing process. The outward direction (the OD arrow direction) is a direction from the center region CA to the first partition wall member 611. Therefore, the first partition wall member 611 may more increase a flow rate and a density of the first gas which is in the first partition wall region PWA1. The first partition wall member 611 may prevent the purge gas injected by the purge gas injection unit 4 from flowing from the center region CA to the first partition wall region PWA1. Accordingly, the substrate processing apparatus 1 according to the present inventive concept may decrease a degree to which under-deposition and under-etching occur relatively in inner portions of the substrates S due to the purge gas, in a process of performing a processing process using the first gas in the first partition wall region PWA1.

The first partition wall member 611 may be disposed apart from each of the first injection unit 51 and the second injection unit 52 in an inward direction (an ID arrow direction). Therefore, the first partition wall member 611 may increase a size of the first partition wall region PWA1 in the inward direction (the ID arrow direction), and thus, may increase a size of a space where the processing process using the first gas is performed. The inward direction (the ID arrow direction) is a direction opposite to the outward direction (the OD arrow direction). The first partition wall member 611 may be disposed apart from the purge gas injection unit 4 in the outward direction (the OD arrow direction).

Figure 7:
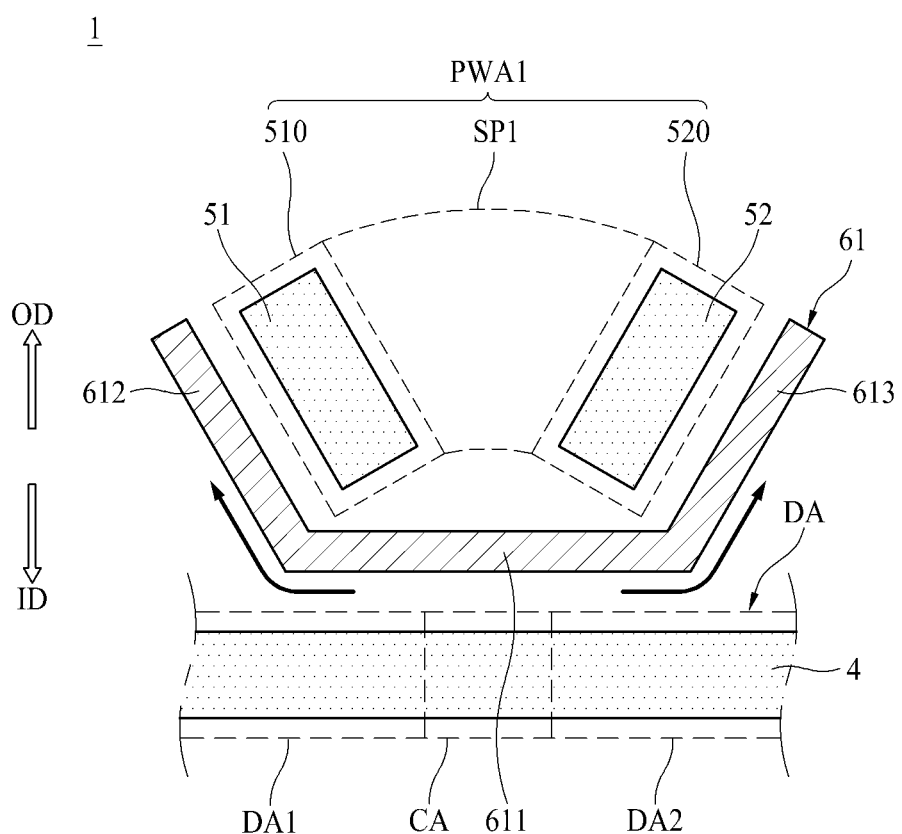
FIG. 7 is a conceptual plan view for describing a first partition wall part in a substrate processing apparatus according to the present inventive concept.

As illustrated in FIG. 7, the first partition wall member 611 may be provided in a rectilinear shape. Therefore, comparing with a case where the first partition wall member 611 is provided to be convex in the outward direction (the OD arrow direction), the substrate processing apparatus 1 according to the present inventive concept may be implemented to decrease a size of a space, enabling the purge gas to stay therein, between the first partition wall member 611 and the purge gas injection unit 4. Accordingly, the substrate processing apparatus 1 according to the present inventive concept may decrease a flow rate of the purge gas staying between the first partition wall member 611 and the purge gas injection unit 4, and thus, may decrease a degree to which under-deposition and under-etching occur relatively in the inner portions of the substrates S due to the purge gas. The first partition wall member 611 may be provided in a rectilinear shape parallel to the purge gas injection unit 4. The first partition wall member 611 may be provided in a rectilinear shape parallel to a portion, disposed in the center region CA, of the purge gas injection unit 4.

Figure 8:
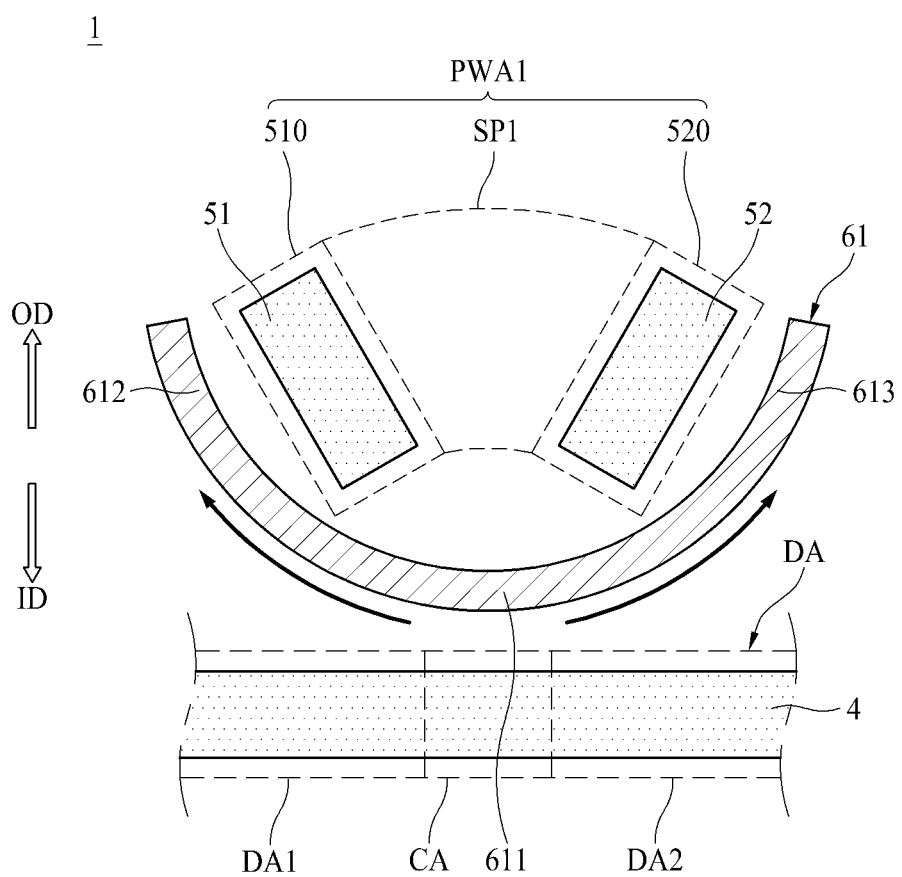
FIGS. 8 and 9 are conceptual plan views for describing a modified embodiment of a first partition wall part in a substrate processing apparatus according to the present inventive concept.

As illustrated in FIG. 8, the first partition wall member 611 may be provided to protrude in the inward direction (the ID arrow direction). Therefore, comparing with an embodiment where the first partition wall member 611 is provided in a rectilinear shape, the substrate processing apparatus 1 according to the present inventive concept may be implemented to more decrease a size of the space, enabling the purge gas to stay therein, between the first partition wall member 611 and the purge gas injection unit 4. Accordingly, the substrate processing apparatus 1 according to the present inventive concept may more decrease a flow rate of the purge gas staying between the first partition wall member 611 and the purge gas injection unit 4. Also, the substrate processing apparatus 1 according to the present inventive concept may more increase a size of the first partition wall region PWA1 by a distance, by which the first partition wall member 611 protrudes in the inward direction (the ID arrow direction), in the inward direction (the ID arrow direction). Accordingly, the substrate processing apparatus 1 according to the present inventive concept may more increase a size of a space where the processing process using the second gas is performed.

The first partition wall member 611 may be provided in a curve shape which is convex in the inward direction (the ID arrow direction). Therefore, as in an arrow illustrated in FIG. 8, the first partition wall member 611 may induce the purge gas injected by the purge gas injection unit 4 to be exhausted. Accordingly, the substrate processing apparatus 1 according to the present inventive concept may be implemented to smoothly exhaust the purge gas, and thus, may more decrease a degree to which under-deposition and under-etching occur relatively in the inner portions of the substrates S due to the purge gas. Accordingly, the substrate processing apparatus 1 according to the present inventive concept may more enhance the uniformity of the processing process using the first gas.

Referring to FIGS. 2 to 9, the first partition wall part 61 may include a second partition wall member 612.

The second partition wall member 612 is coupled to one side of the first partition wall member 611. The second partition wall member 612 may be provided to extend in the outward direction (the OD arrow direction) from the one side of the first partition wall member 611. Therefore, the second partition wall member 612 may be disposed to surround one side of the first partition wall region PWA1. The one side of the first partition wall region PWA1 may be a direction from the second injection unit 52 to the first injection unit 51. The second partition wall member 612 may be disposed in parallel with the first injection unit 51. When the first injection unit 51 is disposed to be inclined at a certain angle, the second partition wall member 612 may be disposed to be inclined at the same angle as the first injection unit 51, and thus, may be disposed in parallel with the first injection unit 51. Although not shown, when three or more injection mechanisms are disposed to be located in the first partition wall region PWA1, the second partition wall member 612 may be disposed in parallel with a injection mechanism which is disposed at an outermost portion toward one side of the first partition wall region PWA1. The second partition wall member 612 and the first partition wall member 611 may be provided as one body.

Figure 9:
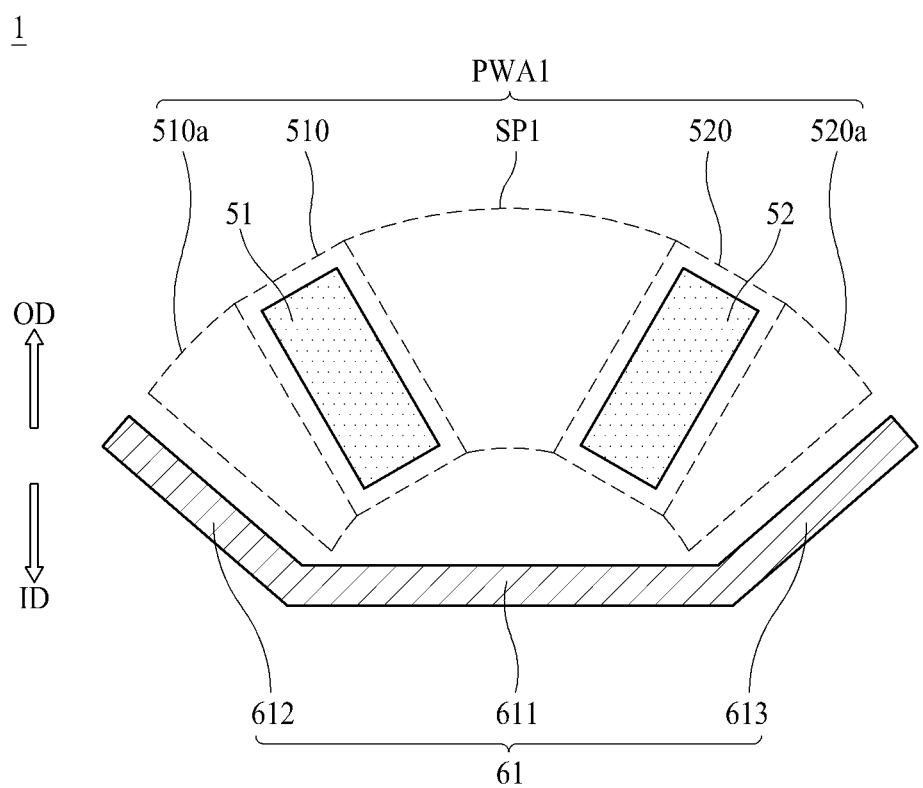
Figure 10:
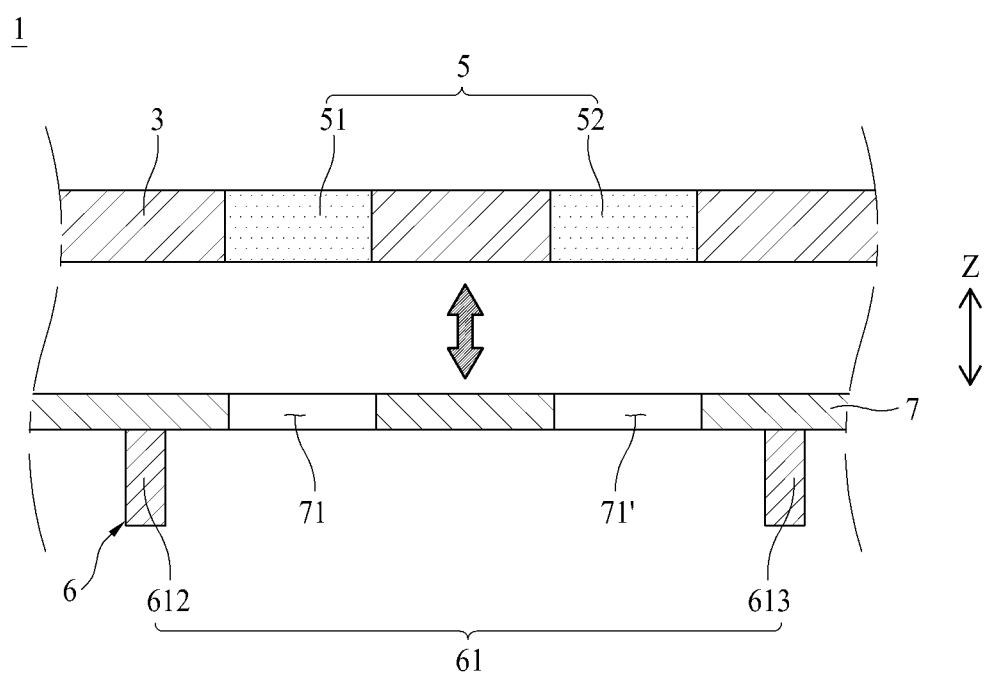
FIG. 10 is a schematic side cross-sectional view illustrating an example where a shield with a partition wall means coupled thereto is attached on or detached from a lid, with respect to line I-I of FIG. 4 in a substrate processing apparatus according to the present inventive concept.

As illustrated in FIG. 9, the second partition wall member 612 may be provided to be inclined so that a distance apart from the first injection unit 51 increases as the second partition wall member 612 extends in the outward direction (the OD arrow direction) from one side of the first partition wall member 611. Therefore, in the substrate processing apparatus 1 according to the present inventive concept, a first enlargement region 510a may be implemented between the second partition wall member 612 and the first partition wall member 611, and thus, a size of the first partition wall region PWA1 may more increase toward the one side of the first partition wall region PWA1. Therefore, in the substrate processing apparatus 1 according to the present inventive concept, a size of a space where the processing process using the first gas is performed may more increase by using the inclined arrangement of the second partition wall member 612. Also, the second partition wall member 612 may induce the purge gas injected by the purge gas injection unit 4 to be exhausted. Accordingly, the substrate processing apparatus 1 according to the present inventive concept may be implemented to smoothly exhaust the purge gas by using the inclined arrangement of the second partition wall member 612, and thus, may more enhance the uniformity of the processing process using the first gas.

Referring to FIGS. 2 to 9, the first partition wall part 61 may include a third partition wall member 613.

The third partition wall member 613 is coupled to the other side of the first partition wall member 611. The third partition wall member 613 may be provided to extend in the outward direction (the OD arrow direction) from the other side of the first partition wall member 611. Therefore, the third partition wall member 613 may be disposed to surround the other side of the first partition wall region PWA1. The other side of the first partition wall region PWA1 may be a direction from the first injection unit 51 to the second injection unit 52. The third partition wall member 613 may be disposed in parallel with the second injection unit 52. When the second injection unit 52 is disposed to be inclined at a certain angle, the third partition wall member 613 may be disposed to be inclined at the same angle as the second injection unit 52, and thus, may be disposed in parallel with the second injection unit 52. Although not shown, when three or more injection mechanisms are disposed to be located in the first partition wall region PWA1, the third partition wall member 613 may be disposed in parallel with a injection mechanism which is disposed at an outermost portion toward the other side of the first partition wall region PWA1. The third partition wall member 613 and the first partition wall member 611 may be provided as one body. The third partition wall member 613, the second partition wall member 612, and the first partition wall member 611 may be provided as one body. The third partition wall member 613, the second partition wall member 612, and the first partition wall member 611 may be provided as one body.

As illustrated in FIG. 9, the third partition wall member 613 may be provided to be inclined so that a distance apart from the second injection unit 52 increases as the third partition wall member 613 extends in the outward direction (the OD arrow direction) from the other side of the first partition wall member 611. Therefore, in the substrate processing apparatus 1 according to the present inventive concept, a second enlargement region 520a may be implemented between the third partition wall member 613 and the first partition wall member 611, and thus, a size of the first partition wall region PWA1 may more increase toward the other side of the first partition wall region PWA1. Therefore, in the substrate processing apparatus 1 according to the present inventive concept, a size of a space where the processing process using the first gas is performed may more increase by using the inclined arrangement of the third partition wall member 613. Also, the third partition wall member 613 may induce the purge gas injected by the purge gas injection unit 4 to be exhausted. Accordingly, the substrate processing apparatus 1 according to the present inventive concept may be implemented to smoothly exhaust the purge gas by using the inclined arrangement of the third partition wall member 613, and thus, may more enhance the uniformity of the processing process using the first gas.

Referring to FIGS. 2 to 9, the first partition wall part 61 may be provided so that an outer portion thereof corresponding to the first partition wall member 611 is open. The outer portion of the first partition wall part 61 is disposed in the outward direction (the OD arrow direction). Therefore, the substrate processing apparatus 1 according to the present inventive concept may exhaust, through the outer portion of the first partition wall part 61, the first gas remaining after being used for the processing process in the first partition wall region PWA1. Accordingly, the substrate processing apparatus 1 according to the present inventive concept may prevent the uniformity of the processing process using the first gas from being reduced by the first gas which remains after being used for the processing process.

Although not shown, the first partition wall part 61 may include a first blocking member which blocks the outer portion. The first blocking member may be coupled to each of the second partition wall member 612 and the third partition wall member 613 so as to be opposite to the first partition wall member 611. In this case, the first partition wall part 61 may be implemented as a type which seals the first partition wall region PWA1.

Referring to FIGS. 2 to 10, the shield 7 is coupled to the lid 3. The shield 7 may be coupled to the lid 3 so as to be disposed under the lid 3 with respect to the vertical direction (the Z-axis direction). The partition wall means 6 may be coupled to the shield 7. The partition wall means 6 may protrude downward from the shield 7 with respect to the vertical direction (the Z-axis direction). The partition wall means 6 and the lid 3 may be provided as one body.

The shield 7 may be detachably coupled to the lid 3. In this case, as the shield 7 is detached from the lid 3, the partition wall means 6 may be detached from the lid 3 along with the shield 7. Therefore, the substrate processing apparatus 1 according to the present inventive concept is implemented so that, in a case where the partition wall means 6 needs to be detached from the lid 3 like a case where maintenance such as repair and replacement is needed for the partition wall means 6 and a case where a length of the partition wall means 6 needs to vary on the basis of a change in a process condition, the partition wall means 6 is easily detached from the lid 3 by detaching the shield 7 from the lid 3. Also, the substrate processing apparatus 1 according to the present inventive concept may couple the shield 7 to the lid 3, and thus, may easily couple the partition wall means 6 to the lid 3. Accordingly, the substrate processing apparatus 1 according to the present inventive concept may enhance the easiness of an operation of attaching/detaching the partition wall means 6 on/from the lid 3, and moreover, may reduce a time taken in the operation of attaching/detaching the partition wall means 6 on/from the lid 3.

The shield 7 may be detachably coupled to the lid 3 by using a fastening means such as a bolt. The shield 7 may be detachably coupled to the lid 3 by using an attachment means having an attachable force. The shield 7 may be detachably coupled to the lid 3 by using a fitting manner.

The shield 7 may be formed of an insulating material. Therefore, in a case where a deposition process is performed on the substrates S, the substrate processing apparatus 1 according to the present inventive concept may prevent a thin film from being unnecessarily deposited on the shield 7, and moreover, by using the shield 7, may prevent a thin film from being unnecessarily deposited on the lid 3. Accordingly, the substrate processing apparatus 1 according to the present inventive concept may prevent the quality of a substrate S, on which the deposition process is completed, from being degraded due to the thin films deposited on the shield 7 and the lid 3, and moreover, may increase a cleaning period of each of the shield 7 and the lid 3. For example, the shield 7 may be formed of ceramic. The partition wall means 6 may be formed of the same material as that of the shield 7.

The shield 7 may be coupled to the lid 3 to cover a whole lower surface of the lid 3 with respect to the vertical direction (the Z-axis direction). In this case, a plurality of through holes 71 and 71' (illustrated in FIG. 10) through which a processing gas injected by the injection means 5 passes may be formed in the shield 7.

As described above, the substrate processing apparatus 1 according to the present inventive concept may be implemented so that the partition wall means 6 is provided therein to surround two or more injection mechanisms injecting the first gas and the partition wall means 6 is not provided therein to surround injection mechanisms injecting the second gas. In this case, the first gas may be a source gas, and the second gas may be a reactant gas. The first gas may be the reactant gas, and the second gas may be the source gas.

Figure 11:
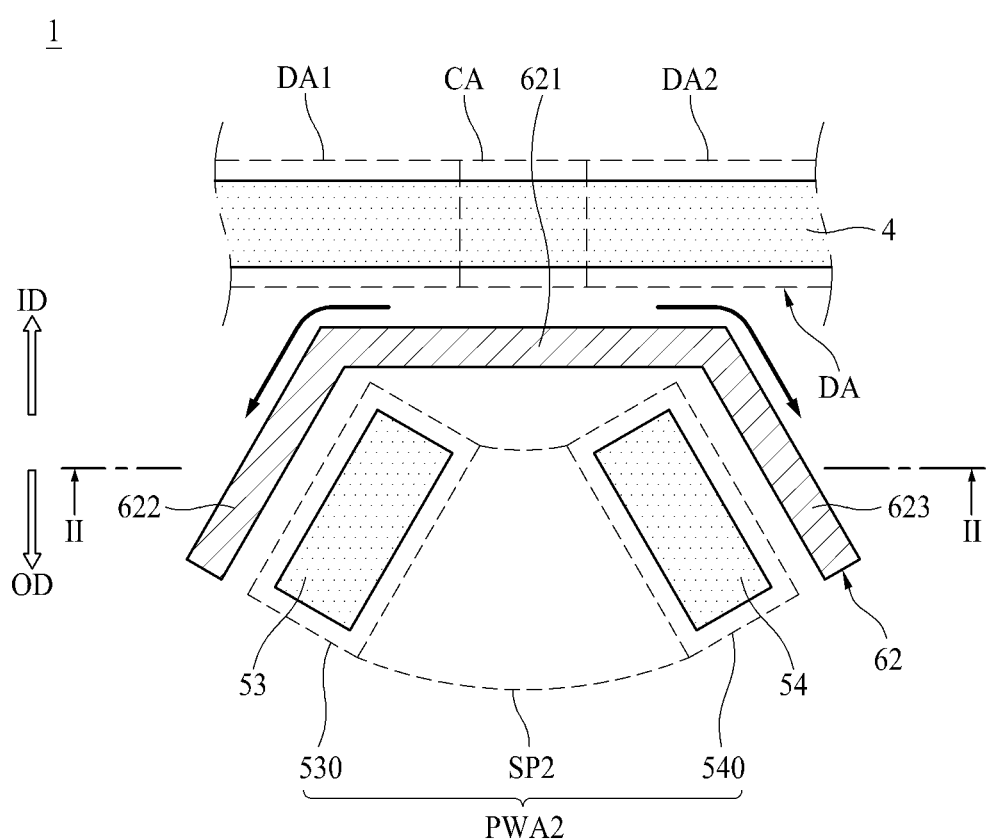
FIG. 11 is a conceptual plan view for describing a second partition wall part in a substrate processing apparatus according to a modified embodiment of the present inventive concept.
Figure 12:
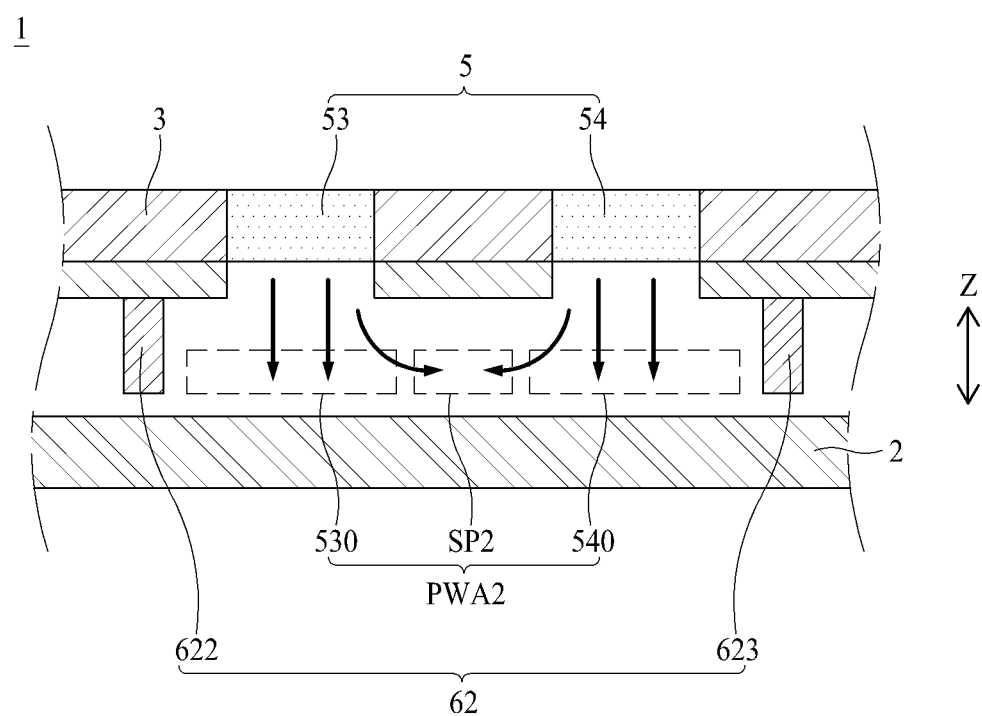
FIG. 12 is a schematic side cross-sectional view taken along line II-II of FIG. 11 in a substrate processing apparatus according to a modified embodiment of the present inventive concept.

Referring to FIGS. 2 to 12, in a substrate processing apparatus 1 according to a modified embodiment of the present inventive concept, the partition wall means 6 may include a second partition wall part 62 (illustrated in FIG. 11).

The second partition wall part 62 may be coupled to the shield 7 so that the third injection region 530, the fourth injection region 540, and the second separation space SP2 are included in a region where a processing process using the second gas is performed. Accordingly, by using the second partition wall part 62, the substrate processing apparatus 1 according to the modified embodiment of the present inventive concept may increase a size of a space where the processing process using the second gas is performed, thereby increasing a processing rate of the processing process using the second gas. Therefore, the substrate processing apparatus 1 according to the modified embodiment of the present inventive concept may increase a density and a flow rate of the second gas which is in the second partition wall part 62, and thus, may more increase a processing rate of the processing process using the second gas and may decrease a flow rate of the second gas which is not used for the processing process and is wasted, thereby reducing the operating cost. Also, by using the second partition wall part 62, the substrate processing apparatus 1 according to the modified embodiment of the present inventive concept may decrease a degree to which under-deposition and under-etching occur relatively in the inner portions of the substrates S due to the purge gas, in a process of performing a processing process using the second gas, and thus, may enhance the uniformity of the processing process using the second gas.

The second partition wall part 62 may be coupled to the shield 7 to surround the third injection region 530, the fourth injection region 540, and the second separation space SP2. Therefore, the second partition wall part 62 may form one space where the third injection region 530, the fourth injection region 540, and the second separation space SP2 communicate with one another. The second partition wall part 62 may surround the third injection region 530, the fourth injection region 540, and the second separation space SP2 in a partially open shape. For example, the second partition wall part 62 may surround the third injection region 530, the fourth injection region 540, and the second separation space SP2 in a shape where a portion opposite to the center region CA is open. Although not shown, the second partition wall part 62 may surround the third injection region 530, the fourth injection region 540, and the second separation space SP2 in a closed shape.

The second partition wall part 62 may be coupled to the shield 7 to protrude downward from the shield 7 with respect to the vertical direction (the Z-axis direction). Therefore, the second partition wall part 62 may prevent the second gas from being diffused to the outside, and moreover, may prevent the purge gas from flowing into the inside. The second partition wall part 62 may be provided to have a length which is shorter than a distance by which the shield 7 is apart from the supporting part 2, with respect to the vertical direction (the Z-axis direction). Accordingly, the second partition wall part 62 may be apart from the supporting part 2. Therefore, in the substrate processing apparatus 1 according to the modified embodiment of the present inventive concept, the second partition wall part 62 and the supporting part 2 may be disposed so that interference does not occur therebetween, and thus, even when a processing process is performed while the substrates S are revolving based on a rotation of the supporting part 2, collision between the second partition wall part 62 and the supporting part 2 may be prevented. In this case, the second partition wall part 62 may be coupled to the shield 7 so as to be disposed at a position upward apart from the substrate S supported by the supporting part 2.

The second partition wall part 62 may protrude to form a second partition wall region PWA2 (illustrated in FIG. 11) where the third injection region 530, the fourth injection region 540, and the second separation space SP2 communicate with one another. In this case, the third injection unit 53 may inject the second gas to the third injection region 530 so that the second gas is diffused in the second partition wall region PWA2. The fourth injection unit 54 may inject the second gas to the fourth injection region 540 so that the second gas is diffused in the second partition wall region PWA2. That is, the second partition wall part 62 may form one second partition wall region PWA2 including the third injection region 530, the fourth injection region 540, and the second separation space SP2. Accordingly, the substrate processing apparatus 1 according to the modified embodiment of the present inventive concept may be implemented so that a processing process using the second gas is performed in the whole second partition wall region PWA2.

The second partition wall part 62 may be coupled to the shield 7 so that the second partition wall region PWA2 has a size which is less than that of the second processing region PA2 (illustrated in FIG. 4). Therefore, comparing with a case where each of the third injection unit 53 and the fourth injection unit 54 injects the second gas to the second processing region PA2 without the second partition wall part 62, the substrate processing apparatus 1 according to the modified embodiment of the present inventive concept may increase a density and a flow rate of the second gas which is in the second partition wall region PWA2. Accordingly, the substrate processing apparatus 1 according to the modified embodiment of the present inventive concept may more increase a processing rate of the processing process using the second gas. A size of each of the second partition wall region PWA2 and the second processing region PA2 may be a size of an area with respect to the horizontal direction vertical to the vertical direction (the Z-axis direction).

The second partition wall part 62 may be disposed apart from each of the third injection unit 53 and the fourth injection unit 54. Therefore, the substrate processing apparatus 1 according to the modified embodiment of the present inventive concept may increase a size of the second partition wall region PWA2 by a distance by which the second partition wall part 62 is apart from each of the third injection unit 53 and the fourth injection unit 54. Accordingly, the substrate processing apparatus 1 according to the modified embodiment of the present inventive concept may increase a size of a space where the processing process using the second gas is performed, thereby increasing a processing rate of the processing process using the second gas.

Although not shown, in a case where the injection means 5 includes three or more injection mechanisms which inject the second gas, the second partition wall part 62 may be coupled to the shield 7 so that the three or more injection mechanisms are located in the second partition wall region PWA2. The partition wall means 6 may include a plurality of second partition wall parts 62. In this case, the second partition wall parts 62 may be coupled to the shield 7 to individually implement the second partition wall regions PWA2. Two or more injection mechanisms injecting the second gas may be disposed in each of the second partition wall regions PWA2.

Referring to FIGS. 2 to 13, the second partition wall part 62 may include a fourth partition wall member 621.

The fourth partition wall member 621 is disposed between the center region CA and the second partition wall region PWA2. Therefore, the fourth partition wall member 621 may prevent the second gas, injected by the third injection unit 530 and the fourth injection unit 540, from flowing from the second partition wall region PWA2 to the center region CA. In this case, a flow direction of the second gas blocked by the fourth partition wall member 621 may be changed so that the second gas flows in the outward direction (the OD arrow direction) (illustrated in FIG. 11), and the second gas may be used for the processing process. The outward direction (the OD arrow direction) is a direction from the center region CA to the fourth partition wall member 621. Therefore, the fourth partition wall member 621 may more increase a flow rate and a density of the second gas which is in the second partition wall region PWA2. The fourth partition wall member 621 may prevent the purge gas injected by the purge gas injection unit 4 from flowing from the center region CA to the second partition wall region PWA2. Accordingly, a degree to which under-deposition and under-etching occur relatively in the inner portions of the substrates S due to the purge gas may be reduced in a process of performing a processing process using the second gas in the second partition wall region PWA2.

The fourth partition wall member 621 may be disposed apart from each of the third injection unit 53 and the fourth injection unit 54 in the inward direction (the ID arrow direction). In this case, the inward direction (the ID arrow direction) is a direction from the fourth partition wall member 621 to the center region CA. Therefore, the fourth partition wall member 621 may increase a size of the second partition wall region PWA2 in the inward direction (the ID arrow direction), and thus, may increase a size of a space where the processing process using the second gas is performed. The fourth partition wall member 621 may be disposed apart from the purge gas injection unit 4 in the outward direction (the OD arrow direction).

As illustrated in FIG. 11, the fourth partition wall member 621 may be provided in a rectilinear shape. Therefore, comparing with a case where the fourth partition wall member 621 is provided to be convex in the outward direction (the OD arrow direction), the substrate processing apparatus 1 according to the modified embodiment of the present inventive concept may be implemented to decrease a size of a space, enabling the purge gas to stay therein, between the fourth partition wall member 621 and the purge gas injection unit 4. Accordingly, the substrate processing apparatus 1 according to the modified embodiment of the present inventive concept may decrease a flow rate of the purge gas staying between the fourth partition wall member 621 and the purge gas injection unit 4, and thus, may decrease a degree to which under-deposition and under-etching occur relatively in the inner portions of the substrates S due to the purge gas. The fourth partition wall member 621 may be provided in a rectilinear shape parallel to the purge gas injection unit 4. The fourth partition wall member 621 may be provided in a rectilinear shape parallel to a portion, disposed in the center region CA, of the purge gas injection unit 4.

Figure 13:
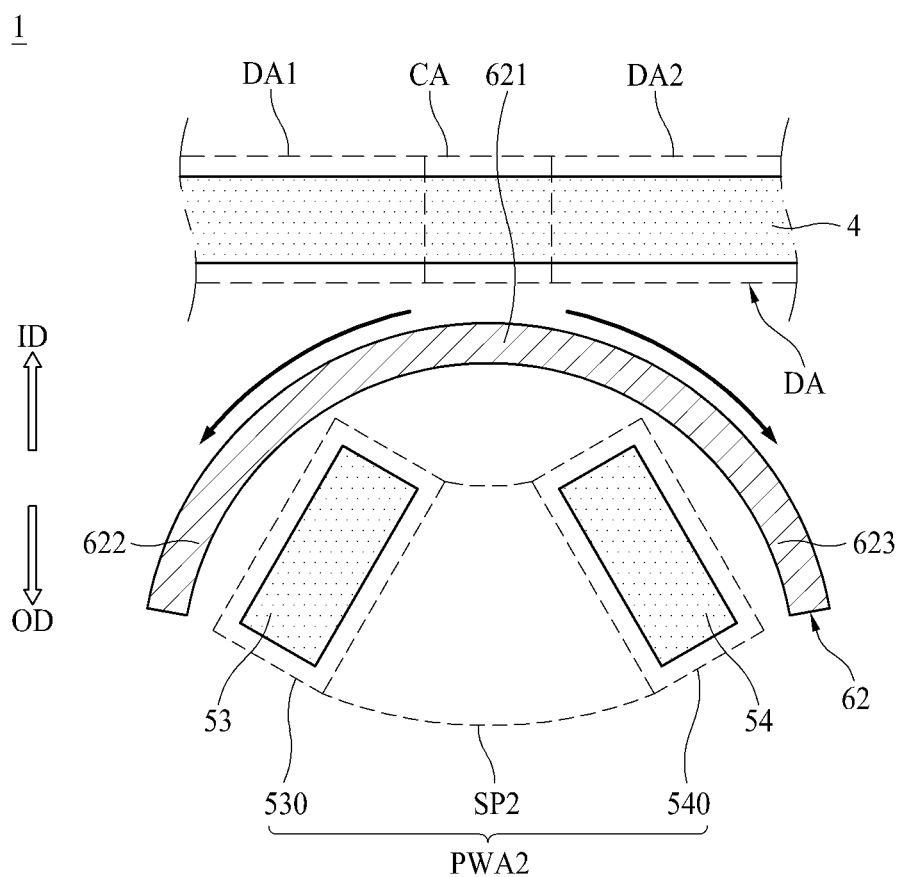
FIGS. 13 and 14 are conceptual plan views for describing a modified embodiment of a second partition wall part in a substrate processing apparatus according to a modified embodiment of the present inventive concept.

As illustrated in FIG. 13, the fourth partition wall member 621 may be provided to protrude in the inward direction (the ID arrow direction). Therefore, comparing with an embodiment where the fourth partition wall member 621 is provided in a rectilinear shape, the substrate processing apparatus 1 according to the modified embodiment of the present inventive concept may be implemented to more decrease a size of the space, enabling the purge gas to stay therein, between the fourth partition wall member 621 and the purge gas injection unit 4. Accordingly, the substrate processing apparatus 1 according to the modified embodiment of the present inventive concept may more decrease a flow rate of the purge gas staying between the fourth partition wall member 621 and the purge gas injection unit 4. Also, the substrate processing apparatus 1 according to the present inventive concept may more increase a size of the second partition wall region PWA2 by a distance, by which the fourth partition wall member 621 protrudes in the inward direction (the ID arrow direction), in the inward direction (the ID arrow direction). Accordingly, the substrate processing apparatus 1 according to the present inventive concept may more increase a size of a space where the processing process using the second gas is performed.

The fourth partition wall member 621 may be provided in a curve shape which is convex in the inward direction (the ID arrow direction). Therefore, as in an arrow illustrated in FIG. 13, the fourth partition wall member 621 may induce the purge gas injected by the purge gas injection unit 4 to be exhausted. Accordingly, the substrate processing apparatus 1 according to the modified embodiment of the present inventive concept may be implemented to smoothly exhaust the purge gas, and thus, may more decrease a degree to which under-deposition and under-etching occur relatively in the inner portions of the substrates S due to the purge gas. Accordingly, the substrate processing apparatus 1 according to the modified embodiment of the present inventive concept may more enhance the uniformity of the processing process using the second gas.

Referring to FIGS. 2 to 14, the second partition wall part 62 may include a fifth partition wall member 622.

The fifth partition wall member 622 is coupled to one side of the fourth partition wall member 621. The fifth partition wall member 622 may be provided to extend in the outward direction (the OD arrow direction) from the one side of the fourth partition wall member 621. Therefore, the fifth partition wall member 622 may be disposed to surround one side of the second partition wall region PWA2. The one side of the second partition wall region PWA2 may be a direction from the fourth injection unit 54 to the third injection unit 53. The fifth partition wall member 622 may be disposed in parallel with the third injection unit 53. When the third injection unit 53 is disposed to be inclined at a certain angle, the fifth partition wall member 622 may be disposed to be inclined at the same angle as the third injection unit 53, and thus, may be disposed in parallel with the third injection unit 53. Although not shown, when three or more injection mechanisms are disposed to be located in the second partition wall region PWA2, the fifth partition wall member 622 may be disposed in parallel with a injection mechanism which is disposed at an outermost portion toward one side of the second partition wall region PWA2. The fifth partition wall member 622 and the fourth partition wall member 621 may be provided as one body.

Figure 14:
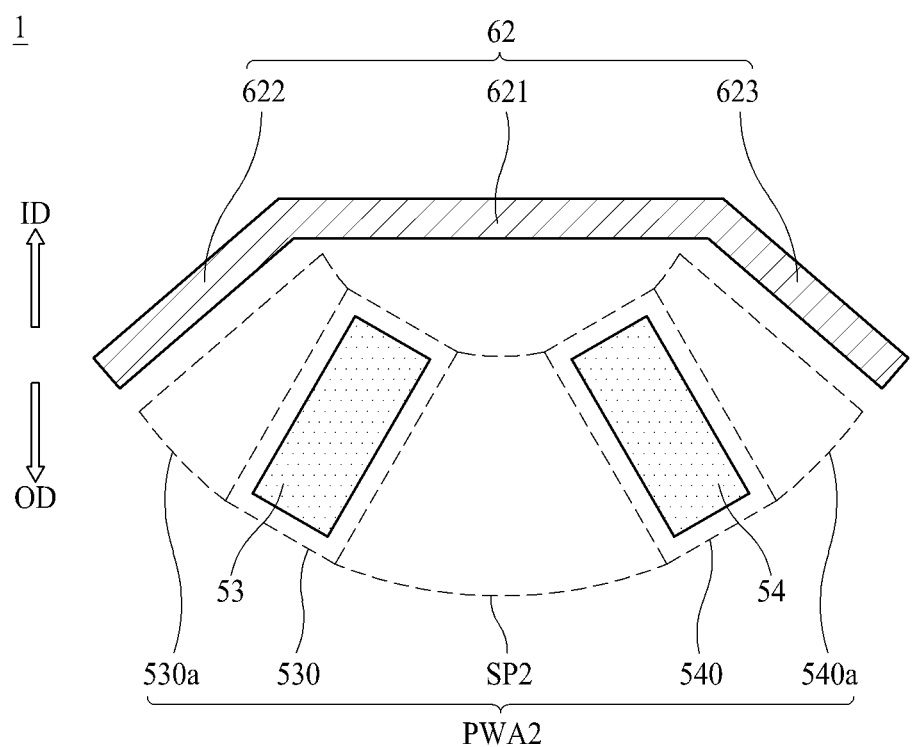

As illustrated in FIG. 14, the fifth partition wall member 622 may be provided to be inclined so that a distance apart from the third injection unit 53 increases as the fifth partition wall member 622 extends in the outward direction (the OD arrow direction) from one side of the fourth partition wall member 621. Therefore, in the substrate processing apparatus 1 according to the modified embodiment of the present inventive concept, a third enlargement region 530a may be implemented between the fifth partition wall member 622 and the fourth partition wall member 621, and thus, a size of the second partition wall region PWA2 may more increase toward the one side of the second partition wall region PWA2. Therefore, in the substrate processing apparatus 1 according to the modified embodiment of the present inventive concept, a size of a space where the processing process using the second gas is performed may more increase by using the inclined arrangement of the fifth partition wall member 622. Also, the fifth partition wall member 622 may induce the purge gas injected by the purge gas injection unit 4 to be exhausted. Accordingly, the substrate processing apparatus 1 according to the modified embodiment of the present inventive concept may be implemented to smoothly exhaust the purge gas by using the inclined arrangement of the fifth partition wall member 622, and thus, may more enhance the uniformity of the processing process using the second gas.

Referring to FIGS. 2 to 14, the second partition wall part 62 may include a sixth partition wall member 623.

The sixth partition wall member 623 is coupled to the other side of the fourth partition wall member 621. The sixth partition wall member 623 may be provided to extend in the outward direction (the OD arrow direction) from the other side of the fourth partition wall member 621. Therefore, the sixth partition wall member 623 may be disposed to surround the other side of the second partition wall region PWA2. The other side of the second partition wall region PWA2 may be a direction from the third injection unit 53 to the fourth injection unit 54. The sixth partition wall member 623 may be disposed in parallel with the fourth injection unit 54. When the fourth injection unit 54 is disposed to be inclined at a certain angle, the sixth partition wall member 623 may be disposed to be inclined at the same angle as the fourth injection unit 54, and thus, may be disposed in parallel with the fourth injection unit 54. Although not shown, when three or more injection mechanisms are disposed to be located in the second partition wall region PWA2, the sixth partition wall member 623 may be disposed in parallel with a injection mechanism which is disposed at an outermost portion toward the other side of the second partition wall region PWA2. The sixth partition wall member 623 and the fourth partition wall member 621 may be provided as one body. The sixth partition wall member 623, the fifth partition wall member 622, and the fourth partition wall member 621 may be provided as one body.

As illustrated in FIG. 14, the sixth partition wall member 623 may be provided to be inclined so that a distance apart from the fourth injection unit 54 increases as the sixth partition wall member 623 extends in the outward direction (the OD arrow direction) from the other side of the fourth partition wall member 621. Therefore, in the substrate processing apparatus 1 according to the modified embodiment of the present inventive concept, a fourth enlargement region 540a may be implemented between the sixth partition wall member 623 and the fourth partition wall member 621, and thus, a size of the second partition wall region PWA2 may more increase toward the other side of the second partition wall region PWA2. Therefore, in the substrate processing apparatus 1 according to the modified embodiment of the present inventive concept, a size of a space where the processing process using the second gas is performed may more increase by using the inclined arrangement of the sixth partition wall member 623. Also, the sixth partition wall member 623 may induce the purge gas injected by the purge gas injection unit 4 to be exhausted. Accordingly, the substrate processing apparatus 1 according to the modified embodiment of the present inventive concept may be implemented to smoothly exhaust the purge gas by using the inclined arrangement of the sixth partition wall member 623, and thus, may more enhance the uniformity of the processing process using the second gas.

Referring to FIGS. 2 to 14, the second partition wall part 62 may be provided so that an outer portion thereof corresponding to the fourth partition wall member 621 is open. The outer portion of the second partition wall part 62 is disposed in the outward direction (the OD arrow direction). Therefore, the substrate processing apparatus 1 according to the modified embodiment of the present inventive concept may exhaust, through the outer portion of the second partition wall part 62, the second gas remaining after being used for the processing process in the second partition wall region PWA2. Accordingly, the substrate processing apparatus 1 according to the modified embodiment of the present inventive concept may prevent the uniformity of the processing process using the second gas from being reduced by the second gas which remains after being used for the processing process.

Although not shown, the second partition wall part 62 may include a second blocking member which blocks the outer portion. The second blocking member may be coupled to each of the fifth partition wall member 622 and the sixth partition wall member 623 so as to be opposite to the fourth partition wall member 621. In this case, the second partition wall part 62 may be implemented as a type which seals the second partition wall region PWA2.

As described above, the substrate processing apparatus 1 according to the modified embodiment of the present inventive concept may be implemented so that the first partition wall part 61 is provided to surround two or more injection mechanisms injecting the first gas and the second partition wall means 62 is provided therein to surround injection mechanisms injecting the second gas.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:
1. A substrate processing apparatus comprising:
a chamber where a processing process is performed on a substrate;
a supporting part coupled to the chamber to support the substrate;
a lid disposed upper the supporting part and coupled to the chamber;
a purge gas injection unit coupled to the lid to inject a purge gas to a processing space between the lid and the supporting part, for dividing the processing space into a plurality of processing regions;
a shield disposed between the lid and the supporting part and coupled to the lid;
a first injection unit injecting a first gas to a first processing region of the processing regions;
a second injection unit injecting the first gas to the first processing region at a position apart from the first injection unit; and
a first partition wall part coupled to the shield so that a first injection region disposed under the first injection unit, a second injection region disposed under the second injection unit, and a first separation space between the first injection region and the second injection region are included in a region where a processing process using the first gas is performed, wherein
the first partition wall part protrudes to form a first partition wall region where the first injection region, the second injection region, and the first separation space communicate with one another,
the first injection region and the second injection region are disposed at positions apart from each other,
the first separation space is disposed between the second injection region and the first injection region,
the first partition wall part comprises a first partition wall member disposed between the first partition wall region and a center region disposed between the processing regions, and
the first partition wall member is provided in a rectilinear shape or is provided to protrude in an inward direction from the first partition wall region to the center region.

2. The substrate processing apparatus of claim 1, wherein the first partition wall part is provided to have a length which is shorter than a distance by which the shield is apart from the supporting part.

3. The substrate processing apparatus of claim 1, wherein the first partition wall part is coupled to the shield so that the first partition wall region has a size which is less than a size of the first processing region.

4. The substrate processing apparatus of claim 1, wherein the first partition wall part is disposed apart from each of the first injection unit and the second injection unit.

5. The substrate processing apparatus of claim 1, wherein the supporting part supports a plurality of substrates, and the center region is disposed inward from the substrates supported by the supporting part.

6. The substrate processing apparatus of claim 1, wherein the first partition wall member is disposed apart from each of the first injection unit and the second injection unit in an inward direction from the first partition wall region to the center region.

7. The substrate processing apparatus of claim 1, wherein the first partition wall member is provided in a curve shape which is convex in the inward direction.

8. The substrate processing apparatus of claim 1, wherein
the first partition wall part comprises a second partition wall member coupled to one side of the first partition wall member,
the second partition wall member is provided to be inclined so that a distance apart from the first injection unit increases as the second partition wall member extends in an outward direction from one side of the first partition wall member, and
wherein the outward direction is a direction from the center region to the first partition wall member.

9. The substrate processing apparatus of claim 8, wherein
the first partition wall part comprises a third partition wall member coupled to the other side of the first partition wall member, and
the third partition wall member is provided to be inclined so that a distance apart from the second injection unit increases as the third partition wall member extends in the outward direction from the other side of the first partition wall member.

10. The substrate processing apparatus of claim 1, wherein the first partition wall part is provided so that an outer portion thereof opposite to the first partition wall member is open.

11. The substrate processing apparatus of claim 1, wherein
the shield is detachably coupled to the lid, and
as the shield is detached from the lid, the first partition wall part is detached from the lid along with the shield.

12. The substrate processing apparatus of claim 1, wherein the shield and the first partition wall part are provided as one body.

13. The substrate processing apparatus of claim 1, further comprising:
a third injection unit injecting a second gas to a second processing region of the processing regions;
a fourth injection unit injecting the second gas to the second processing region at a position apart from the third injection unit; and
a second partition wall part coupled to the shield so that a third injection region disposed under the third injection unit, a fourth injection region disposed under the fourth injection unit, and a second separation space between the third injection region and the fourth injection region are included in a region where a processing process using the second gas is performed.

14. The substrate processing apparatus of claim 13, wherein the second partition wall part protrudes to form a second partition wall region, where the third injection region, the fourth injection region, and the second separation space communicate with one another, and is coupled to the shield so that the second partition wall region has a size which is less than a size of the second processing region.

15. The substrate processing apparatus of claim 13, wherein the second partition wall part is disposed apart from each of the third injection unit and the fourth injection unit.

16. The substrate processing apparatus of claim 1, wherein the first partition wall part is coupled to the shield to surround the first injection region, the second injection region, and the first separation space.

* * * * *